(12) United States Patent
Shen et al.

(10) Patent No.: US 9,222,986 B2
(45) Date of Patent: Dec. 29, 2015

(54) DISTRIBUTED BATTERY MANAGEMENT SYSTEM AND METHOD OF IDENTIFICATION DISTRIBUTION USING THE SAME

(71) Applicants: SHENZHEN BYD AUTO R&D COMPANY LIMITED, Shenzhen, Guangdong (CN); BYD COMPANY LIMITED, Shenzhen, Guangdong (CN)

(72) Inventors: Xiaofeng Shen, Guangdong (CN); Shuping Li, Guangdong (CN); Jiaojiao Sun, Guangdong (CN); Gang Liu, Guangdong (CN); Haijun Yu, Guangdong (CN)

(73) Assignees: Shenzhen BYD Auto R&D Company Limited, Shenzhen, Guangdong (CN); BYD Company Limited, Shenzhen, Guangdong (CN)

( * ) Notice: Subject to any disclaimer, the term of this patent is extended or adjusted under 35 U.S.C. 154(b) by 0 days.

(21) Appl. No.: 14/260,034

(22) Filed: Apr. 23, 2014

(65) Prior Publication Data
US 2014/0236510 A1 Aug. 21, 2014

Related U.S. Application Data

(63) Continuation of application No. PCT/CN2012/081735, filed on Sep. 21, 2012.

(30) Foreign Application Priority Data

Oct. 25, 2011 (CN) .......................... 2011 1 0327479

(51) Int. Cl.
*G01R 29/00* (2006.01)
*G05B 15/02* (2006.01)
(Continued)

(52) U.S. Cl.
CPC ........ *G01R 31/3606* (2013.01); *G06F 11/3065* (2013.01); *H04Q 9/00* (2013.01);
(Continued)

(58) Field of Classification Search
None
See application file for complete search history.

(56) References Cited

U.S. PATENT DOCUMENTS

| 6,885,307 B2 * | 4/2005 | Lockhart ................ G08B 25/08 324/433 |
| 8,341,449 B2 * | 12/2012 | Daniel ..................... H04Q 9/00 713/340 |

(Continued)

FOREIGN PATENT DOCUMENTS

| CN | 1291367 A | 4/2001 |
| CN | 1711661 A | 12/2005 |

(Continued)

OTHER PUBLICATIONS

PCT International Search Report and Written Opinion mailed Dec. 27, 2012, issued in International Application No. PCT/CN2012/081735 (12 pages).

*Primary Examiner* — Edward Cosimano
(74) *Attorney, Agent, or Firm* — Finnegan, Henderson, Farabow, Garrett & Dunner, LLP

(57) ABSTRACT

A distributed battery management device and a method thereof are provided. The method comprises: receiving, by a battery management control module, a first identification distribution request from a first data acquisition module; activating, by the battery management control module, the first data acquisition module for monitoring one or more batteries; and sending, by the battery management control module, a first identification message corresponding to the first identification distribution request, to the first data acquisition module. The device comprises: a battery management control module; and a first data acquisition module communicatively coupled with the battery management control module, wherein the battery management control module and the first data acquisition module are configured to communicate with each other to identify the data acquisition module.

15 Claims, 3 Drawing Sheets

(51) Int. Cl.
  *G06F 17/40* (2006.01)
  *G06F 19/00* (2011.01)
  *G01R 31/36* (2006.01)
  *G06F 11/30* (2006.01)
  *H04Q 9/00* (2006.01)
  *H01M 10/42* (2006.01)

(52) U.S. Cl.
  CPC ............ *G01R 29/00* (2013.01); *G01R 31/3658* (2013.01); *G05B 15/02* (2013.01); *G06F 17/40* (2013.01); *G06F 19/00* (2013.01); *H01M 10/4207* (2013.01); *H01M 2220/00* (2013.01); *H04Q 2209/10* (2013.01); *H04Q 2209/30* (2013.01)

(56) References Cited

U.S. PATENT DOCUMENTS

2004/0178918 A1\* 9/2004 Lockhart et al. ............ 340/636.1
2011/0258471 A1\* 10/2011 Daniel .................... H04Q 9/00 713/340

FOREIGN PATENT DOCUMENTS

| CN | 102110860 A | | 6/2011 |
| GB | 2341258 A | \* | 3/2000 |
| WO | WO 2011/118711 A1 | | 9/2011 |
| WO | WO 2013/060212 A1 | | 5/2013 |

\* cited by examiner

DISTRIBUTED BATTERY MANAGEMENT SYSTEM AND METHOD OF IDENTIFICATION DISTRIBUTION USING THE SAME

CROSS-REFERENCE TO RELATED APPLICATIONS

This application is a continuation of International Application No. PCT/CN2012/081735, filed on Sep. 21, 2012, which claims priority to and benefits of Chinese Patent Application Serial No. 201110327479.6, filed with the State Intellectual Property Office of China (SIPO) on Oct. 25, 2011. The entire contents of the above-referenced applications are incorporated herein by reference.

FIELD

The present disclosure relates to battery management field, and more particularly to a distributed battery management system and a method of identification distribution using the same.

BACKGROUND

A battery management system generally is divided into a centralized battery management system and a distributed battery management system. The distributed battery management system generally comprises a battery management control module and at least one data acquisition module, in which the data acquisition module is used for collecting parameters such as voltages, electric currents or temperatures of a plurality of battery cells. One advantage of the distributed battery management system is being capable of managing the battery cells and making equalization charging easy. With the increase in the number of the battery cells, the port resources of the battery management control module may be easy to expand, and the problem of wire harnessing may be easy to solve. However, the number of the data acquisition modules may increase with the number of the battery cells. The distributed battery management system uses a plurality of data acquisition modules, and in order to reduce costs, the data acquisition modules used by the distributed battery management system are the same, which may bring the CAN (Controller Area Network) reread problem among the data acquisition modules.

For the communication between a plurality of data acquisition modules and the battery management control module, solving the problem of data communication conflict has become the first and foremost task. At present, there are four main methods to solve the problem of the communication conflict of the distributed management system.

The first method is to assign different CAN bus identities (ID) for each data acquisition module, and to use a different application program on each module. This method makes the management of the application programs difficult, and consequently it becomes difficult for the data acquisition modules to be mounted in a vehicle, and the post-maintenance becomes difficult as well.

The second method is to add an identification module to the hardware of each data acquisition module. Different data acquisition modules have different identification modules to be identified with a program to solve the problem of communication conflict. This method causes difficulty during the producing and managing of the data acquisition module, and consequently it becomes difficult for the data acquisition modules to be mounted in a vehicle, and the post-maintenance becomes difficult as well.

The third method is to couple an external jumper circuit to the data acquisition module, to make use of the jumper circuit to set different statuses for the I/O port of each data acquisition module, and to give a CAN bus address corresponding to each data acquisition module for each status of the I/O port, so as to distinguish signals from each data acquisition module and to solve the problem of communication conflict of the distributed battery management system. Compared with the first and the second methods, one advantage of this method is that different application programs for each module is not needed, the hardware modules are uniform, and the battery cells are easy to manage. However, the external jumper needs to be set manually and is error-prone. Once an error is introduced, the method cannot self-identify and self-correct the error.

The fourth method is to couple a plurality of data acquisition modules in series, and to couple the battery management control module with the first data acquisition module in the series. After the first data acquisition module is activated, the next data acquisition module connected in series is activated, to distribute the identification among the modules. One advantage of this method is that it realizes the identification distribution by software, and the design is simple. However, because different data acquisition modules in the series have different functions, the application programs on the modules may also be different. This brings inconvenience to the design of the data acquisition modules and limits the selection of the data acquisition module, since a corresponding data acquisition module needs to be selected based on the sequence of activation. Moreover, because the data acquisition modules coupled in series are activated sequentially, if a line connecting two data acquisition modules is broken, the identification distribution will fail, and the entire system will be paralyzed.

Thus, there is a need for a distributed battery management system which allows convenient assignment of identification of individual data acquisition modules, and is easily scalable.

SUMMARY

The present disclosure is aimed to solve at least one of the problems, particularly defects of communication conflict, low reliability and high complexity. Accordingly, a distributed battery management system and a method of identification distribution using the same are provided.

According to an aspect of the present disclosure, a method of identification distribution using a distributed battery management system is provided, in which the distributed battery management system comprises a battery management control module and a plurality of data acquisition modules electrically coupled with the battery management control module respectively. The method comprises steps of: a) all the data acquisition modules sending identification distribution requests to the battery management control module; b) the battery management control module activating a data acquisition module, and sending to the data acquisition module an identification message corresponding to the identification distribution request from the data acquisition module; c) the data acquisition module determining itself whether it is activated, and if yes, receiving and storing the identification message and sending an identification distribution reply and the identification message received to the battery management control module, otherwise, the data acquisition module sending another identification distribution request to the battery management control module and performing step b) to activate the data acquisition module; and d) after the battery management control module receiving the identification distribution reply and the identification message, performing step b) to step d) to realize an identification distribution of a next data acquisition module.

According to another aspect of the present disclosure, a distributed battery management system is provided. The distributed battery management system comprises a battery management control module and a plurality of data acquisition modules electrically coupled with the battery management control module respectively. The battery management control module comprises an activating unit and a selecting unit. The data acquisition module comprises a requesting unit and a determining unit. The requesting unit is configured to send an identification distribution request to the battery management control module. The activating unit is configured to activate a data acquisition module and to send an identification message corresponding to the identification distribution request after receiving the identification distribution request from the requesting unit. The determining unit is configured to determine whether the data acquisition module is activated, and if yes, to receive and store the identification message and to send an identification distribution reply and the identification message received to the battery management control module, otherwise, to inform the requesting unit to send another identification distribution request to the battery management control module. The selecting unit is configured to select a next data acquisition module to perform identification distribution after receiving the identification distribution reply and the identification message from the data determining unit.

With the distributed battery management system and the method of identification distribution using the same according to embodiments of the present disclosure, since the battery management control module is electrically coupled with the plurality of data acquisition modules respectively, the battery management control module may perform identification distribution for the plurality of data acquisition modules sequentially. Therefore, the plurality of data acquisition modules do not need to depend on each other, but work independently of each other; and the data acquisition modules may use the same hardware and software, and thus the selection and design of the data acquisition module may be easier so as to make the distributed battery management system and the method of identification distribution using the same according to embodiments of the present disclosure more simple.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
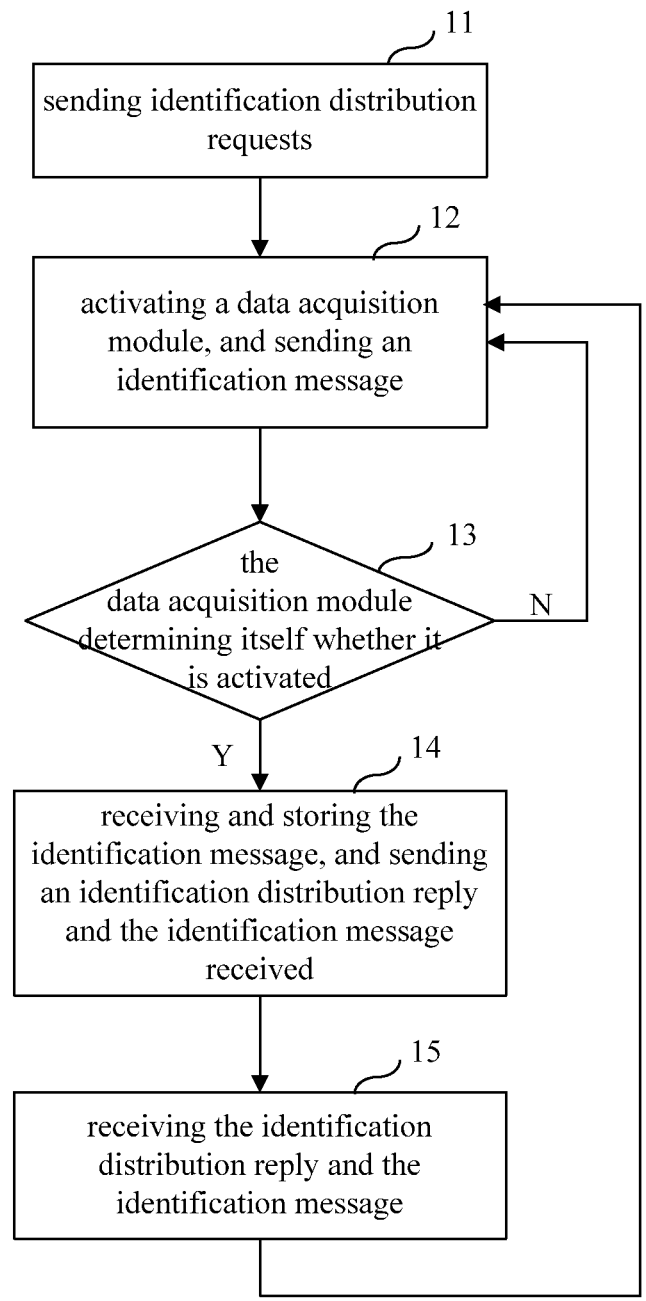
FIG. 1 is a flowchart illustrating an exemplary method of identification distribution using a distributed battery management system according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

According to an embodiment of the present disclosure, a method of identification distribution using a distributed battery management system is provided, in which the distributed battery management system comprises a battery management control module and a plurality of data acquisition modules electrically coupled with the battery management control module respectively. FIG. 1 is a flowchart illustrating a method of identification distribution using a distributed battery management system according to an embodiment of the present disclosure. As shown in FIG. 1, the method comprises the following steps.

In step 11), all the data acquisition modules send identification distribution requests to the battery management control module.

In step 12), the battery management control module activates a data acquisition module, and sends to the data acquisition module an identification message corresponding to the identification distribution request from the data acquisition module.

In step 13), the data acquisition module determines itself whether it is activated, and if yes, step 14) is performed, otherwise, the data acquisition module sends another identification distribution request to the battery management control module and step 12) is performed to activate the data acquisition module.

In some embodiments, the data acquisition module may be activated by the battery management control module immediately to complete the identification distribution. In some embodiments, the battery management control module may activate the data acquisition modules sequentially in a predetermined order or a random order, and the identification distribution of the data acquisition modules may be completed following that order.

In some embodiments, the determination of whether a data acquisition module is activated may be realized by, for example, monitoring the status of an activation line between the data acquisition module and the battery management control module. In an embodiment, a high voltage level on the activation line represents an active status, and a low voltage level represents an inactive status.

In step 14), the data acquisition module receives and stores the identification message, and sends an identification distribution reply and the identification message received to the battery management control module.

In step 15), after the battery management control module receives the identification distribution reply and the identification message, which means that the identification distribution of the data acquisition module has been completed, step 12) to step 15) are repeated to realize an identification distribution of a next data acquisition module.

In some embodiments, when the method of identification distribution according to embodiments of the present disclosure just starts, all the data acquisition modules are in an inactive status. The data acquisition modules are then activated one after one along with the use of the method of identification distribution according to embodiments of the present disclosure. The data acquisition modules may be activated sequentially by the battery management control module in a predetermined order or a random order. The predetermined order may be determined by software algorithms in the battery management control module, that is, the activation order of the data acquisition modules is preset by software algorithms. The predetermined order may be set arbitrarily by a designer.

In some embodiments, the method of identification distribution further comprises: starting to count time, and performing step 12) to step 15) to realize the identification distribution of the next data acquisition module when the counted time exceeds a predetermined time. One advantage of the method of identification distribution according to embodiments of the present disclosure is that the appearance of the endless loop of the whole identification distribution due to the failure of some data acquisition modules may be avoided, thus allowing the method of identification distribution using the distributed battery management system according to embodiments of the present disclosure to be carried out smoothly.

In an embodiment, the predetermined time may be 5 seconds. In some embodiments, the predetermined time may be set arbitrarily in accordance with the specific needs.

Figure 2:
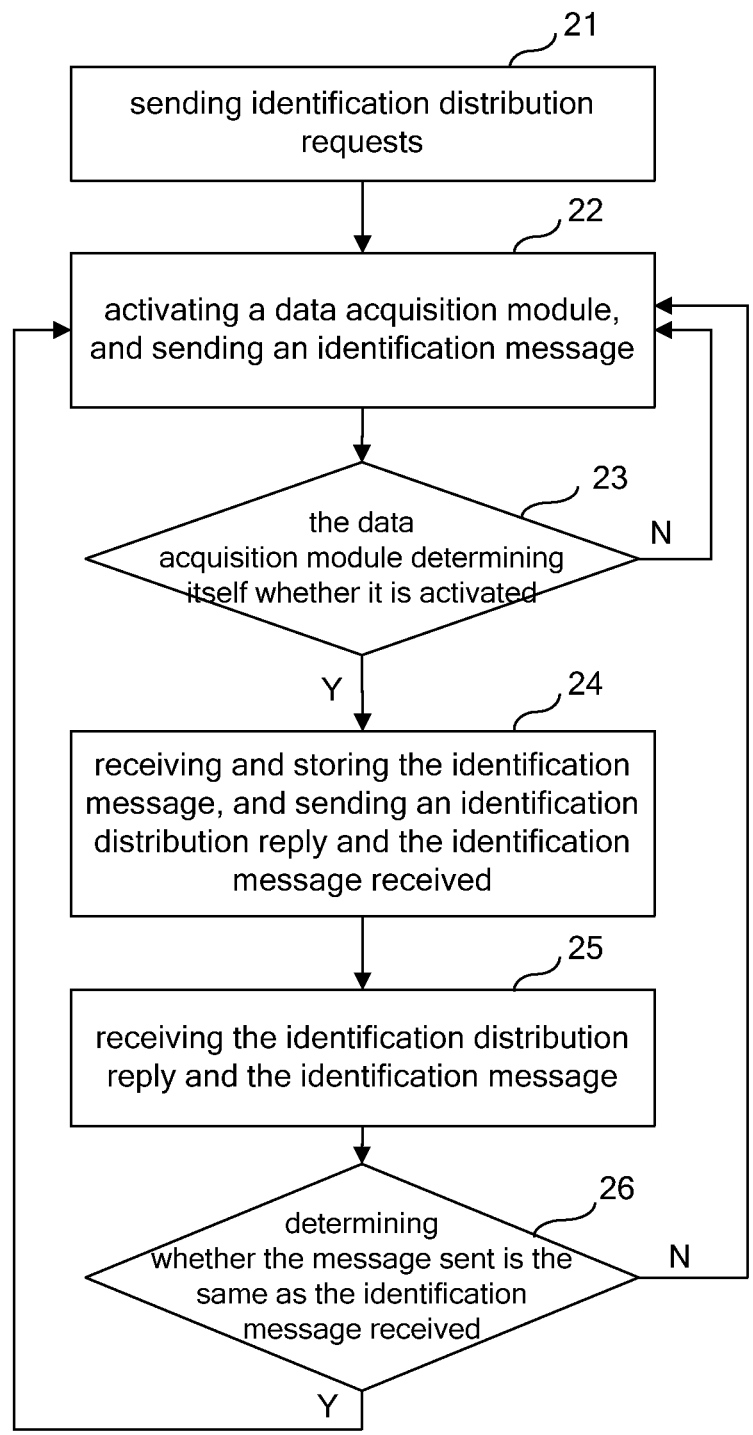
FIG. 2 is a flowchart illustrating an exemplary of identification distribution using a distributed battery management system according to another embodiment of the present disclosure.

FIG. 2 is a flowchart illustrating a method of identification distribution using a distributed battery management system according to another embodiment of the present disclosure. As shown in FIG. 2, the method comprises the following steps.

In step 21), all the data acquisition modules send identification distribution requests to the battery management control module.

In step 22), the battery management control module activates a data acquisition module, and sends to the acquisition module an identification message corresponding to the identification request from the data acquisition module.

In step 23), the data acquisition module determines itself whether it is activated, and if yes, step 24) is performed, otherwise, the data acquisition module sends another identification distribution request to the battery management control module and step 22) is performed to activate the data acquisition module.

In step 24), the data acquisition module receives and stores the identification message, and sends an identification distribution reply and the identification message received to the battery management control module.

In step 25), after the battery management control module receives the identification distribution reply and the identification message, and in step 26), the battery management control module determines whether the identification received by the acquisition module is the same as the identification sent by the control module to the acquisition module. If yes (which may indicate that the identification distribution of the data acquisition module has been completed), step 22) to step 25) are performed to realize the identification distribution of the next data acquisition module; otherwise, the identification message corresponding to the identification distribution request from the data acquisition module is sent again and step 23) to step 25) are repeated.

Such an arrangement can avoid introduction of error when the battery management control module performs identification distribution for the data acquisition modules, which may include sending a wrong identification message, thus improving the accuracy of the identification distribution with the distributed battery management system according to embodiments of the present disclosure.

In some embodiments, the method of identification distribution further comprises: when the battery management control module receiving the identification distribution replies from all the data acquisition modules, terminating the identification distribution of all the data acquisition modules, which means the completion of the identification distribution of all the data acquisition modules. It may be understood that in the aforementioned embodiments, even when the identification distribution of the data acquisition modules in the distributed battery management system has been realized, the post-maintenance may still be needed. That is, when the battery management control module determines that one or more data acquisition modules exhibit abnormal behavior, the abnormal data acquisition modules can be activated, and then the identification distribution of the abnormal data acquisition modules can be performed according to the methods in step 13) to step 15) or in step 23 to step 25) in the aforementioned embodiments. Such an arrangement makes the identification distribution more robust. It should be noted herein that, when an acquisition module exhibits abnormal behavior, typically it refers to the fact that the identification message stored in the data acquisition module is lost, becomes invalid (for example, the identification message contains messy codes), or exhibits other abnormal status.

Figure 3:
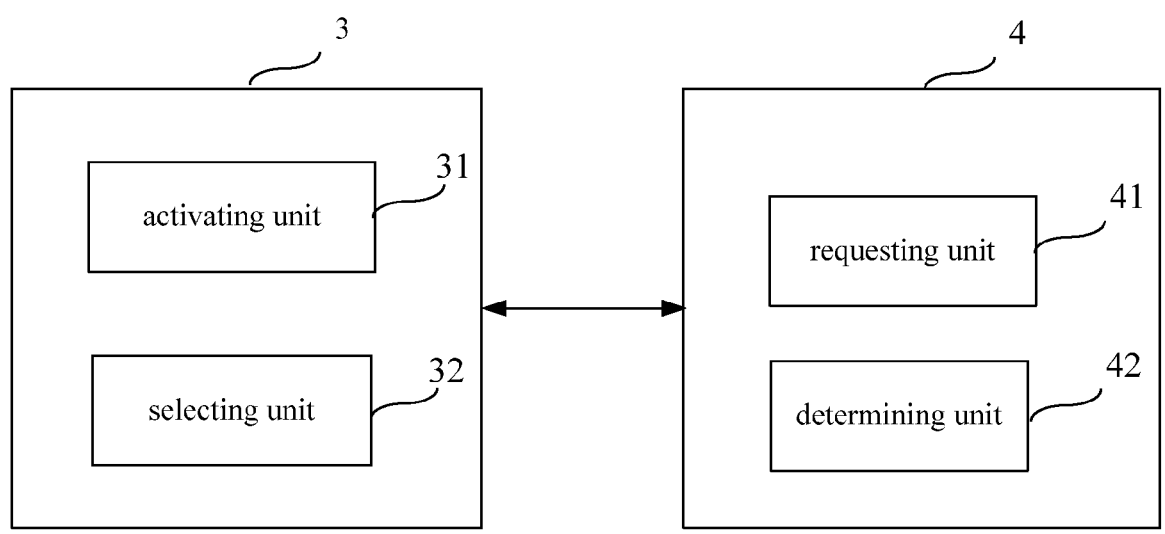
FIG. 3 is a block diagram illustrating an exemplary distributed battery management system according to an embodiment of the present disclosure.

According to embodiments of the present disclosure, a distributed battery management system is also provided, as shown in FIG. 3. The distributed battery management system comprises a battery management control module 3 and a plurality of data acquisition modules 4. The battery management control system 3 may be electrically coupled with the data acquisition modules 4 respectively. The battery management control module 3 comprises an activating unit 31 and a selecting unit 32. The data acquisition module 4 comprises a requesting unit 41 and a determining unit 42.

The requesting unit 41 is configured to send an identification distribution request to the battery management control module 3.

The activating unit 31 is configured to activate a data acquisition module 4 and to send an identification message corresponding to the identification distribution request after receiving the identification distribution request from the requesting unit 41.

The determining unit 42 is configured to determine whether the data acquisition module 4 is activated, and if yes, to receive and store the identification message and to send an identification distribution reply and the identification massage received to the battery management control module 3, otherwise, to inform the requesting unit 41 to send another identification distribution request to the battery management control module 3.

The selecting unit 32 is configured to select a next data acquisition module 4 to perform identification distribution after receiving the identification distribution reply and the identification message from the determining unit 42.

In an embodiment, the selecting unit 32 may be configured to select the next data acquisition module 4 to perform identification distribution in a predetermined order or a random order.

In an embodiment, the battery management control module 3 may further comprise a counting unit (not shown in FIG. 3). The counting unit is configured to start to count when the activating unit 31 sends the identification message corresponding to the identification distribution request to the data acquisition module 4, and to inform the selecting unit 32 to select the next acquisition module 4 to perform identification distribution when the counted time exceeds a predetermined time. One purpose of this embodiment is to avoid the appearance of the endless loop of the whole identification distribution due to the failure of some data acquisition modules, thus allowing the method of identification distribution using the distributed battery management system according to embodiments of the present disclosure to be carried out smoothly.

In an embodiment, the predetermined time may be 5 seconds.

In another embodiment, the battery management control module 3 may further comprise an identification message determining unit (not shown in FIG. 3). The identification message determining unit is configured to determine whether the identification message received is the same as the identification message sent, and if yes, to inform the selecting unit 32 to select the next data acquisition module 4 to perform identification distribution, otherwise, to inform the activating unit 31 to send the identification message corresponding to the identification distribution request again. One purpose of this embodiment is to avoid introduction of error when the battery management control module 3 performs identification distribution for the data acquisition modules 4, which may include sending a wrong identification message. Such an arrangement improves the accuracy of the identification distribution with the distributed battery management system according to embodiments of the present disclosure.

In yet another embodiment, the battery management control module 3 may further comprise a fault determining unit (not shown in FIG. 3). The fault determining unit is configured to determine whether the data acquisition modules 4 exhibit abnormal behavior, and to inform the battery management control module 3 to activate abnormal data acquisition modules 4 and to perform identification distribution when one or more data acquisition modules 4 exhibit abnormal behaviors (for example, the identification messages stored in the data acquisition modules 4 are in abnormal state, such as being lost or invalid). Such an arrangement makes the identification distribution with the distributed battery management according to embodiments of the present disclosure more robust.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A method for distributed battery management, the method comprising steps of:
    receiving, by a battery management control module, a first identification distribution request from a first data acquisition module configured to acquire at least one parameter of one or more battery cells and to communicate with the battery management control module;
    activating, by the battery management control module, the first data acquisition module for monitoring one or more battery cells;
    sending, by the battery management control module, a first identification message corresponding to the first identification distribution request, to the first data acquisition module; and
    determining, by the first data acquisition module, whether the first data acquisition module is activated;
    sending, by the first data acquisition module, a second identification distribution request to the battery management control module if the first data acquisition module is determined to be not activated; and
    receiving, by the first data acquisition module, the first identification message, and sending, by the first data acquisition module, an identification distribution reply and a second identification message to the battery management control module if the first data acquisition module is determined to be activated.

2. The method according to claim 1, wherein the first and the second identification messages are identical.

3. The method according to claim 1, further comprising: counting for an amount of time;
    and wherein the activating of the first data acquisition module occurs when the counted time exceeds a predetermined time.

4. The claim according to claim 1, further comprising:
    receiving, by the battery management control module, a second identification message;
    determining, by the battery management control module, whether the first identification message is identical to the second identification message; and
    sending, by the battery management control module, a third identification message corresponding to the first identification distribution request, if the first identification message is determined to be not identical to the second identification message.

5. The method according to claim 1, further comprising:
    terminating, by the battery management control module, the identification distribution of the first data acquisition module after receiving the identification distribution reply from the first data acquisition module.

6. The method according to claim 1, further comprising:
    determining, by the battery management control module, whether a second data acquisition module is in an abnormal state; and
    activating, by the battery management control module, the second data acquisition module if the second data acquisition module is determined to be in the abnormal state.

7. The method according to claim 1, wherein the first identification message comprises identification assigned to the first data acquisition module.

8. The method according to claim 1, wherein the at least one parameter is selected from voltages, electric currents, and temperatures.

9. A battery management device, comprising:
    a battery management control module configured to:
        receive a first identification request sent from a first data acquisition module communicatively coupled with the battery management control module;
        send a first identification message corresponding to the first identification request; and
        activate the first data acquisition module;
    wherein the battery management control module and the first data acquisition module are configured to communicate with each other to identify the data acquisition module, and
    the first acquisition module is configured to:
        acquire at least one parameter of one or more battery cells;
        determine whether the first data acquisition module is activated;
        send a second identification distribution request to the battery management control module if the first data acquisition module is determined to be not activated; and
        receive the first identification message and send an identification distribution reply and a second identification message to the battery management control module if the first data acquisition module is determined to be activated.

10. The device according to claim 9, wherein the first and the second identification messages are identical.

11. The device according to claim 9, wherein the battery management control module is further configured to count for an amount of time, and wherein the first data acquisition module is activated when the counted time exceeds a predetermined time.

12. The device according to claim 9, wherein the battery management control module is further configured to:
   receive a second identification message;
   determine whether the first identification message and the second identification message are identical; and
   send a third identification message corresponding to the first identification request if the first and the second identification messages are determined to be not identical.

13. The device according to claim 9, further comprising a second data acquisition module, wherein the battery management control module is further configured to:
   determine whether the second data acquisition module is in an abnormal state; and
   activate the second data acquisition module if the second data acquisition module is determined to be in the abnormal state.

14. The device according to claim 9, wherein the first identification message comprises identification assigned to the first data acquisition module.

15. The device according to claim 9, wherein the at least one parameter is selected from voltages, electric currents, and temperatures of a plurality of battery cells.

\* \* \* \* \*